United States Patent
Katoch

(10) Patent No.: US 9,390,787 B2
(45) Date of Patent: Jul. 12, 2016

(54) BIASING BULK OF A TRANSISTOR

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/168,165

(22) Filed: Jan. 30, 2014

(65) Prior Publication Data

US 2014/0269023 A1 Sep. 18, 2014

Related U.S. Application Data

(60) Provisional application No. 61/799,634, filed on Mar. 15, 2013.

(51) Int. Cl.
*G11C 11/00* (2006.01)
*G11C 11/419* (2006.01)

(52) U.S. Cl.
CPC .................. *G11C 11/419* (2013.01)

(58) Field of Classification Search
USPC ..................... 365/154, 156, 189.09
See application file for complete search history.

(56) References Cited

U.S. PATENT DOCUMENTS

| 6,166,985 A * | 12/2000 | McDaniel et al. ....... 365/230.06 |
| 2005/0276094 A1 * | 12/2005 | Yamaoka et al. ............. 365/154 |
| 2012/0002460 A1 * | 1/2012 | Rimondi et al. .............. 365/156 |

* cited by examiner

*Primary Examiner* — Vu Le
(74) *Attorney, Agent, or Firm* — Hauptman Ham, LLP

(57) ABSTRACT

A circuit comprises a first transistor of a first type, a second transistor of a second type, and a third transistor of the first type or the second type. The first transistor and the second transistor form an inverter. The third transistor is coupled with an output of the inverter. The circuit includes at least one of the following voltage sources: a first voltage source, a second voltage source, and a third voltage source. The first voltage source is coupled with a bulk of the first transistor, and is different from a first supply voltage source of the first transistor. T second voltage source is coupled with a bulk of the second transistor, and is different from a second supply voltage of the second transistor. The third voltage source is coupled with a bulk of the third transistor.

20 Claims, 16 Drawing Sheets

US 9,390,787 B2

BIASING BULK OF A TRANSISTOR

FIELD

The present disclosure is related to biasing a bulk of a transistor.

BACKGROUND

In some approaches, a static random access memory (SRAM) cell includes a storage node coupled with a pass gate transistor and a pull-up transistor. When the pass gate transistor is turned on, the pass gate transistor carries a current, such as a current Ionpg. When the pull-up transistor is turned on, the pull-up transistor carries another current, such as a current Ionpu. A ratio RAT of a value of current Ionpu over a value of current Ionpg determines how fast data can be written to the storage node. In other words, ratio RAT determines writing ability of the memory cell. Different attempts have been made to improve writing ability of memory cells. Such improvements, however, each have their own deficiencies.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
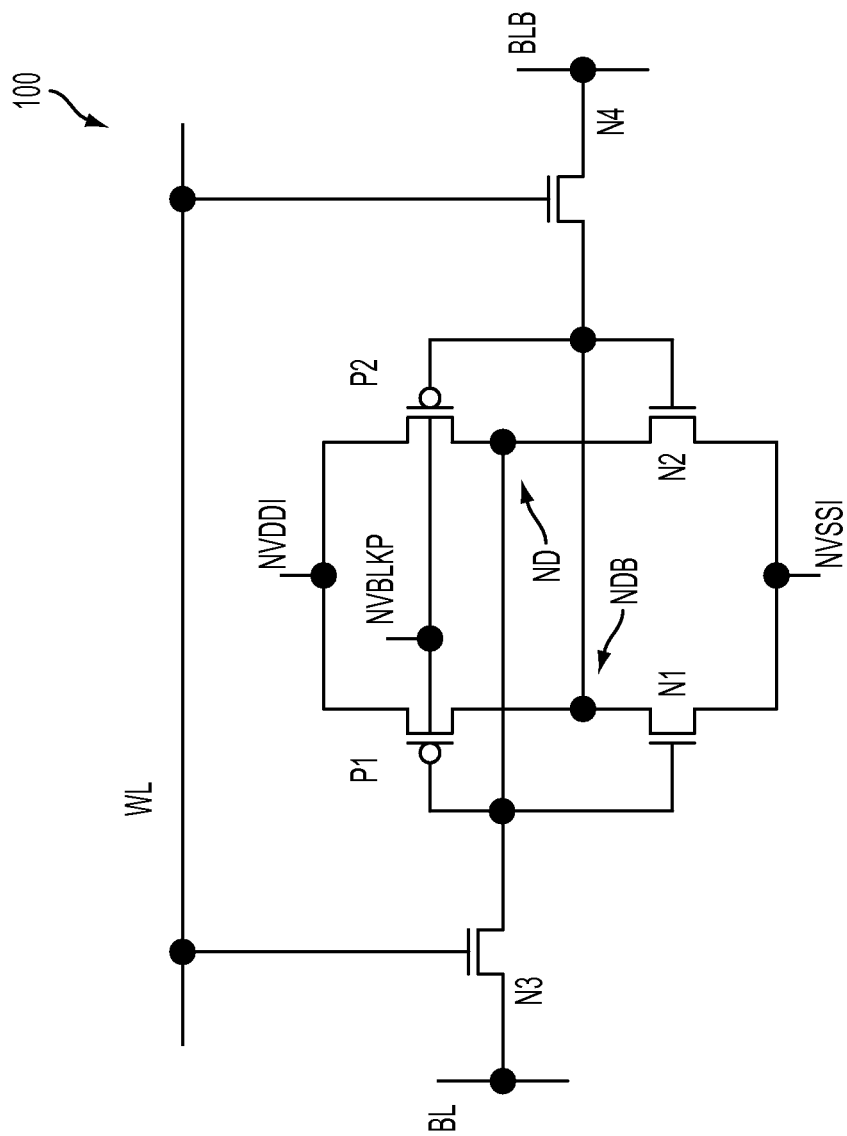
FIG. 1 is a diagram of a circuit of a memory cell in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a memory cell includes a storage node coupled with a pass gate transistor and a pull-up transistor. During a write operation of the memory cell, a bulk or a well, such as an N-well, of the pull-up transistor is configured to receive a bias voltage value different from a default voltage value of the bulk. As a result, compared with another approach, a driving strength of the pull-up transistor is reduced. Writing data to the memory cell is therefore faster, and can be achieved at a supply voltage VDD value lower than the supply voltage value VDD when the bulk is at the default voltage value.

Memory Cell

FIG. 1 is a diagram of a circuit or a memory cell 100, in accordance with some embodiments.

Memory cell 100 includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch or a cross-coupled pair of inverters. For example, transistor P1 and transistor N1 form a first inverter while transistor P2 and transistor N2 form a second inverter. PMOS transistors P1 and P2 are called pull-up transistors. NMOS transistors N1 and N2 are called pull-down transistors. NMOS transistors N3 and N4 are called pass gate transistors.

Sources of transistors P1 and P2 are coupled together and serve as a supply voltage node NVDDI having a supply voltage VDD (not labeled). A bulk of a PMOS transistor, such as PMOS transistor P1 or P2 is also called an N-well. Bulks of transistors P1 and P2 are coupled together as a bulk node NVBLKP, and receive a bulk-biasing voltage VBLKP (not labeled). A drain of transistor P1 is coupled with a drain of transistor N1, a storage node NDB, a gate of transistor P2, a gate of transistor N2, and a source of transistor N4. A drain of transistors P2 is coupled with a drain of transistor N2, a storage node ND, a gate of transistor P1, a gate of transistor N1, and a source of transistor N3. Sources of transistors N1 and N2 are coupled together and serve as supply reference voltage node NVSSI having a supply reference voltage VSS (not labeled).

A word line WL is coupled with a gate of each of transistors N3 and N4. In a row having a plurality of memory cells 100, word line WL is coupled with a gate of each of transistors N3 and N4 of the plurality of memory cells 100 in the row. Word line WL is also called a write control line because a signal on word line WL controls transistors N3 and N4 for data on bit lines BL and BLB to be written to corresponding nodes ND and NDB.

A drain of transistor N3 is coupled with a bit line BL. A drain of transistor N4 is coupled with a bit line BLB. In a column having a plurality of memory cells 100, bit lines BL and BLB are coupled with each drain of corresponding transistors N3 and N4 of the plurality of memory cells 100 in the column.

Bit lines BL and BLB serve as both data inputs and outputs for memory cell 100. Each of bit lines BL and BLB is also called a data line because the data carried on bit lines BL and BLB are written to and read from corresponding nodes ND and NDB.

Writing Data

In some embodiments, in a write operation of memory cell 100, applying a logical value to a first bit line, such as bit line BL, and an opposite logical value to the other bit line, such as bit line BLB, enables writing the logical values at bit lines BL and BLB to nodes ND and NDB of memory cell 100. Word line WL is then activated to turn on transistors N3 and N4. As a result, node ND is electrically coupled with bit line BL, and node NDB is electrically coupled with bit line BLB. The data on bit lines BL and BLB is therefore transferred to nodes ND and NDB, respectively. Explained in another way, when word line WL is activated, the data on bit lines BL and BLB is written to nodes ND and NDB, respectively.

For illustration, node ND stores a high logical value, and is written with a low logical value. Because node ND stores a high logical value, by operation of memory cell 100, node NDB stores a low logical value. As a result, PMOS transistor P1 is off, NMOS transistor N1 is on, PMOS transistor P2 is on, and NMOS transistor N2 is off. In some embodiments, a low logical value is applied to bit line BL. Word line WL is activated to turn on transistor N3. Because NMOS transistor N3 is on, NMOS transistor N3 tends to pull node ND towards a low logical value of bit line BL. Because PMOS transistor P2 is on, PMOS transistor P2 tends to pull node ND towards supply voltage VDD on node NVDDI at the source of PMOS transistor P2. Explained in a different way, transistor N3 and transistor P2 each have a current driving capability, and, a current driving contention exists between NMOS transistor N3 and PMOS transistor P2. Because of the contention, writing data to node ND takes a longer time than writing to node ND without the contention.

In various embodiments of the present disclosure, mechanisms are provided to reduce the contention between NMOS transistor N3 and PMOS transistor P2. In some embodiments, voltage VBLKP on node NVBLKP is set at a default voltage value, such as supply voltage value VDD. Voltage VBLKP is then adjusted to reduce the contention. For example, when voltage VBLKP is increased from supply voltage value VDD, the driving strength of transistor P2 becomes weaker. In other words, transistor P2 becomes weaker. Explained differently, a ratio of the driving strength of transistor N3 to that of transistor P2 becomes greater. As a result, the driving strength of transistor N3 is dominant, and the contention between transistor N3 and transistor P2 is reduced. Consequently, writing a logical low value to overwrite a high logical value on node ND becomes faster. Effectively, a writing speed to node ND and memory cell 100 increases.

For illustration, voltage VBLKP is set at a default value of supply voltage VDD of about 1.0 V. Voltage VBLKP is then increased to be higher than supply voltage value VDD by a voltage $\Delta VP$ such that writing to node ND is acceptable and memory cell 100 continues to function normally. In some embodiments, voltage $\Delta VP$ is determined based on simulation. For example, a plurality of N memory cells 100 is selected for the simulation. Voltage $\Delta VP$ is set to be about 150 mV. Voltage VBLKP is thus about 1.150 V. In some embodiments, with such a voltage level of about 1.150 V for voltage VBLKP, the data stored in some cells 100 is reliably valid, while the data stored in some other cells 100 is no longer valid. Voltage VBLKP is then decreased until the data stored in all N memory cells 100 is reliably valid. At that point, voltage VBLKP is selected to be used in memory cell 100. In some embodiments, voltage VBLKP is about 1.1 V, or voltage $\Delta VP$ is about 100 mV for N memory cells 100 to store data validly. An increase in a writing speed of N memory cells 100 is achieved based on voltage $\Delta VP$ of about 100 mV. The above mechanism to determine voltage $\Delta VP$ is for illustration. Other ways to determine voltage $\Delta VP$ are within the contemplated scope of the present disclosure. For example, voltage $\Delta VP$ is determined based on a binary search, by being set at 0 V and is increased until at least one memory cell fails, and the voltage value before the at least one memory cell fails is selected, etc.

Another Memory Cell

Figure 2:
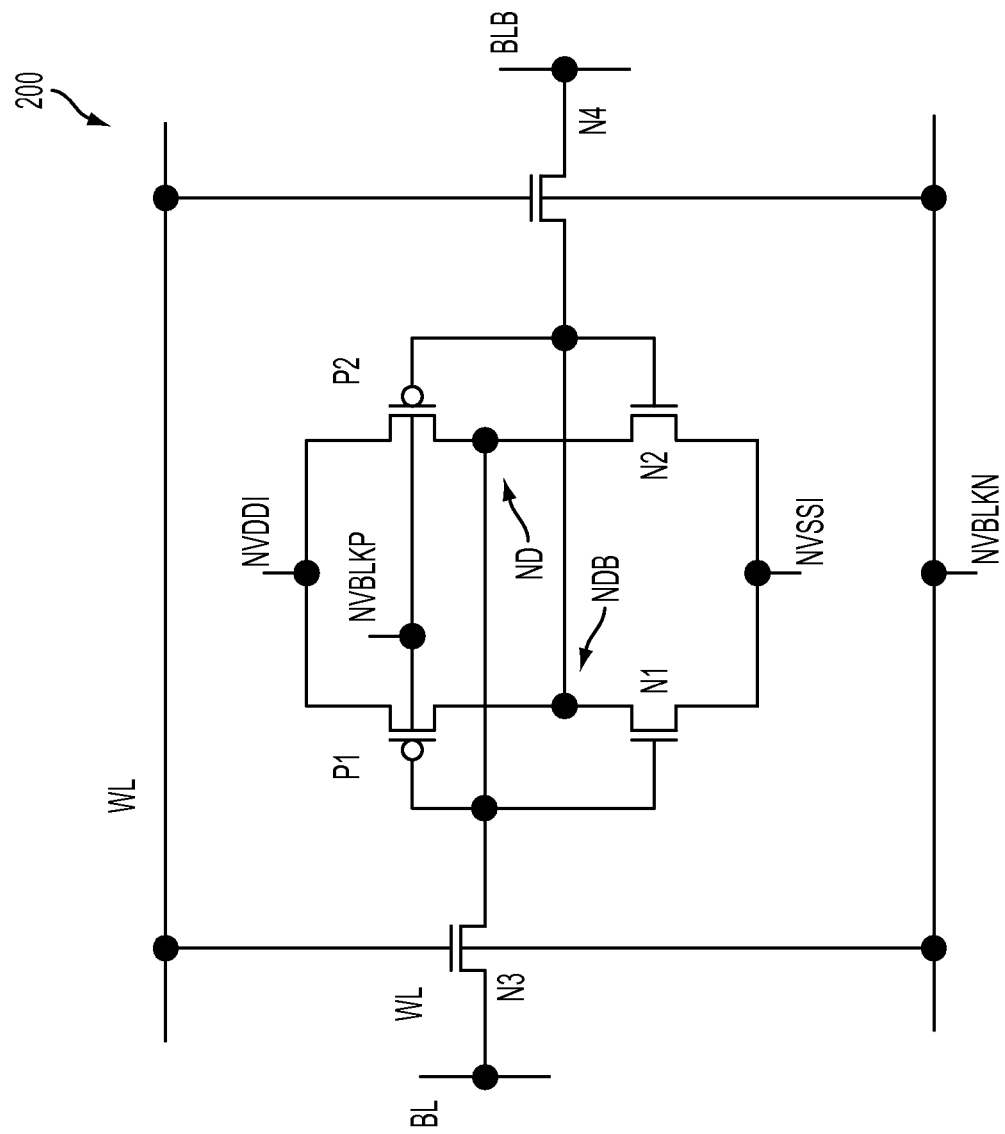
FIG. 2 is a diagram of a circuit of another memory cell, in accordance with some embodiments.

FIG. 2 is a diagram of a circuit or a memory cell 200, in accordance with some embodiments.

Compared with circuit 100, bulks of transistors N3 and N4 are coupled together and form a node NVBLKN having a bulk-biasing voltage VBLKN (not labeled). For illustration, voltage VBLKP at the bulk of transistors P1 and P2 is set at the default value of supply voltage value VDD. In some embodiments, bulks of NMOS transistors N1 and N2 are not coupled with the bulks of transistors N3 and N4 as shown in FIG. 2. In some embodiments, the bulks of NMOS transistors N1 and N2 are coupled with the bulks of NMOS transistors N3 and N4, and therefore also receive voltage VBLKN.

In some embodiments, voltage VBLKN on node NVBLKN is set a default value of reference supply voltage VSS or 0 V. Voltage VBLKN is then adjusted to reduce the contention between transistor N3 and transistor P2. When voltage VBLKN is increased above supply voltage VSS, transistor N3 becomes stronger. As a result, the driving strength of transistor N3 is dominant, and the contention between transistor N3 and transistor P2 is reduced. Consequently, writing a logical low value to overwrite a high logical value on node ND becomes faster. In other words, a writing speed to node ND of memory cell 200 increases.

In some embodiments, voltage VBLKN is increased to be higher than supply reference voltage value VSS by a voltage $\Delta VN$. In some embodiments, voltage $\Delta VN$ is determined based on simulation. For example, a plurality of N memory cells 200 is selected for the simulation. Voltage $\Delta VN$ is set to be about 150 mV. Voltage VBLKN is thus about 150 mV. In some embodiments, with a voltage level of about 150 mV at node NVBLKN, the data stored in some memory cells 200 is reliably valid, while the data stored in some other memory cells 200 is no longer valid. Voltage VBLKN and voltage $\Delta VN$ are then decreased until the data stored in all N memory cells 200 is reliably valid. At that point, voltage VBLKN and voltage $\Delta VN$ are chosen to be used in memory cell 200. In some embodiments, voltage $\Delta VN$ is about 100 mV for the data stored in N memory cells 100 is reliably valid. An increase in a writing speed of N memory cells 200 is achieved based on voltage $\Delta VN$ of about 100 mV. The above mechanism to determine voltage $\Delta VN$ is for illustration. Other ways to determine voltage $\Delta VN$ are within the contemplated scope of the present disclosure. For example, voltage $\Delta VN$ is determined based on a binary search, by being set at 0 V and is increased until at least one memory cell 200 fails, and a value of voltage ΔVN before at least one memory cell 200 fails is chosen.

In the above illustration with reference to FIGS. 1 and 2, each of voltage ΔVP or ΔVN is adjusted separately for illustration. Both voltages ΔVP and ΔVN being adjusted are within the contemplated scope of the present disclosure.

Waveforms

Figure 3:
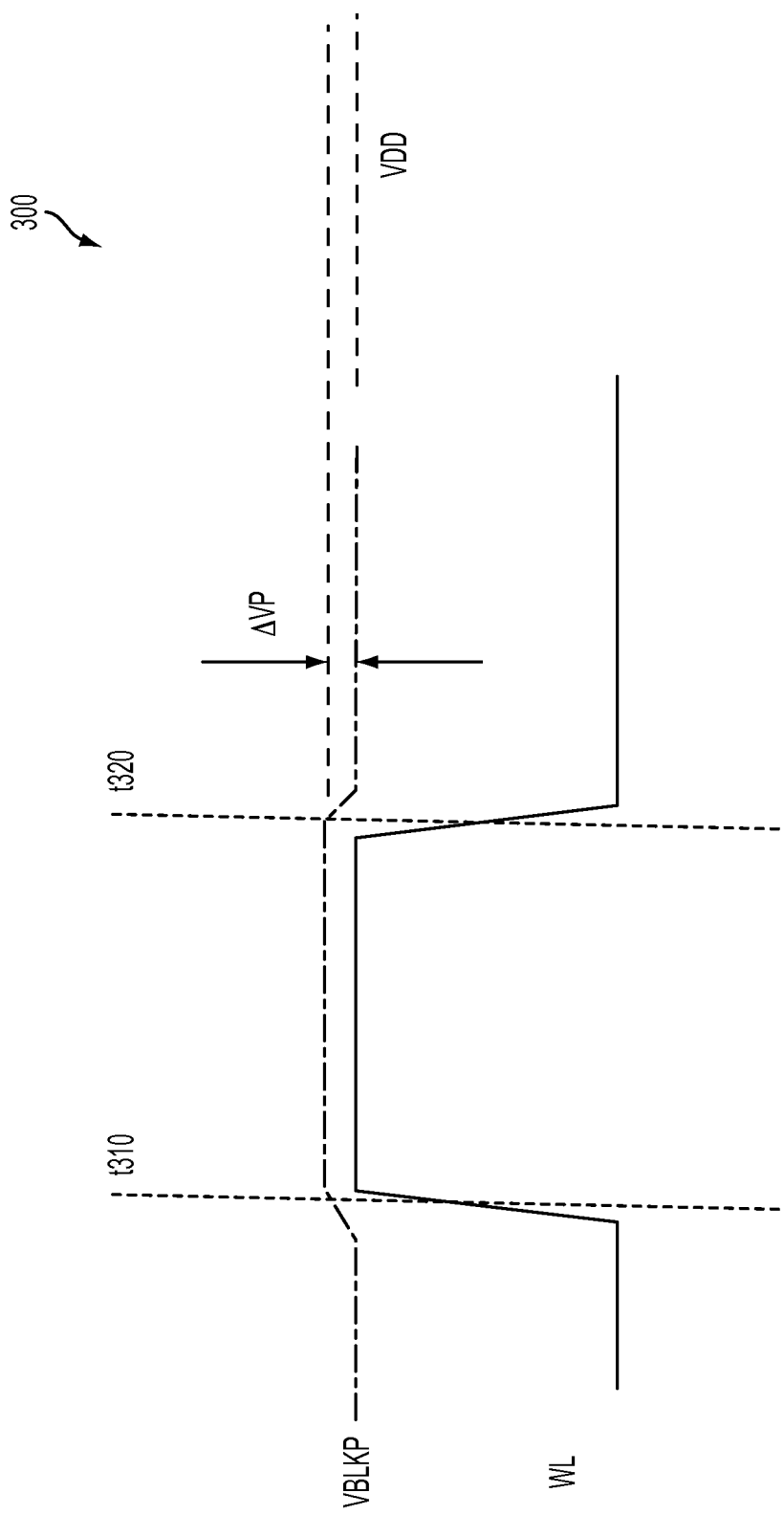
FIG. 3 is a graph of waveforms of various signals of the memory cell in FIG. 2, in accordance with some embodiments.

FIG. 3 is a graph of waveforms 300, in accordance with some embodiments. Waveforms 300 are used to illustrate timings when voltage VBLKP is at the default value of supply voltage value VDD or when voltage VBLKP is increased by voltage ΔVP.

Prior to a time t310, voltage VBLKP is at the default value of supply voltage value VDD. At about time t310, word line WL in FIG. 1 transitions from a low to a high logical value. For illustration, the logical high value of word line WL is voltage VDD. As word line WL is logically high, transistor N3 is turned on, and the data on bit line BL is transferred to node ND. At about time t310 or prior to time t310, voltage VBLKP is raised from voltage VDD by voltage ΔVP. Because voltage VBLKP is raised, PMOS transistor P2 is weakened. By the time word line WL is logically high and transistor N3 is turned on, a time to replace existing data on node ND by the data transferred from bit line BL is decreased. Effectively, writing data to node ND or to memory cell 100 is faster.

At a time t320, when writing data to node ND is complete, word line WL transitions from a high to a low logical value. At about time t320 or subsequent to time t320, voltage VBLKP returns to the default value of VDD.

In FIG. 3 voltage VBLKP is used for illustration. Voltage VBLKN is adjusted in a manner similar to voltage VBLKP in FIG. 3. For example, at about time t310 or prior to time t310, voltage VBLKN is increased from voltage VSS by voltage ΔN. At about time t320 or subsequent to time t320, voltage VBLKN returns to the default value of voltage VSS.

Circuits to Generate Voltage VBLKP and Voltage VBLKN

Figure 4A:
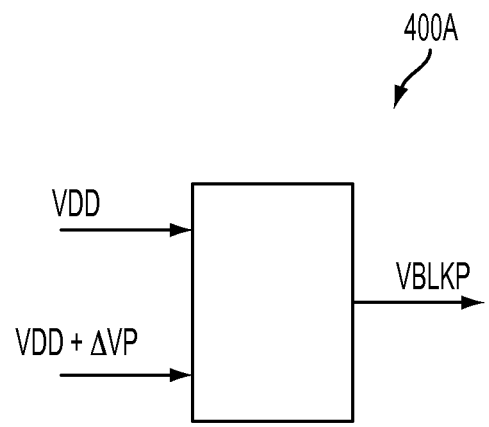
FIG. 4A is a diagram of a circuit generating voltage VBLKP, in accordance with some embodiments.

FIG. 4A is a diagram of a selection circuit 400A, in accordance with some embodiments. Selection circuit 400A is used to provide a voltage value for voltage VBLKP. For example, prior to time t310 and subsequent to time t320 in FIG. 3, circuit 400A selects voltage value VDD as a voltage value for voltage VBLKP. In contrast, between time t310 and time t320, circuit 400A selects a voltage value VDD+ΔVP as a value for voltage VBLKP. Explained in a different way, voltage VBLKP is at the default value of voltage VDD before time t310 and subsequent to time t320, and is increased by voltage ΔVP between time t310 and time t320.

Figure 4B:
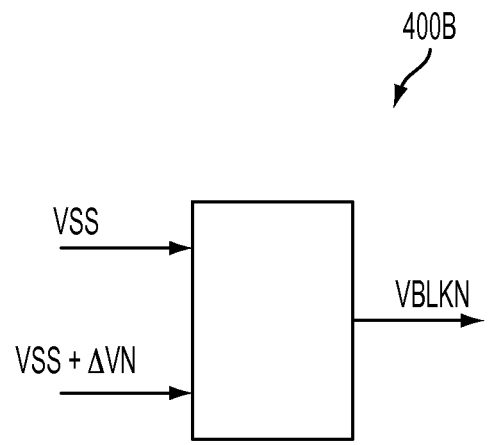
FIG. 4B is a diagram of a circuit generating voltage VBLKN, in accordance with some embodiments.

FIG. 4B is diagram of a selection circuit 400B, in accordance with some embodiments. Selection circuit 400B is used to provide a voltage value for voltage VBLKN. For example, prior to time t310 and subsequent to time t320, circuit 400B selects voltage value VSS as a voltage value for voltage VBLKN. In contrast, between time t310 and time t320, circuit 400B selects a voltage value VSS+ΔVN as a value for voltage VBLKN. Explained in a different way, voltage VBLKN is at the default value of voltage VSS before time t310 and subsequent to time t320, and is increased by voltage ΔVN between time t310 and time t320.

Figure 4C:
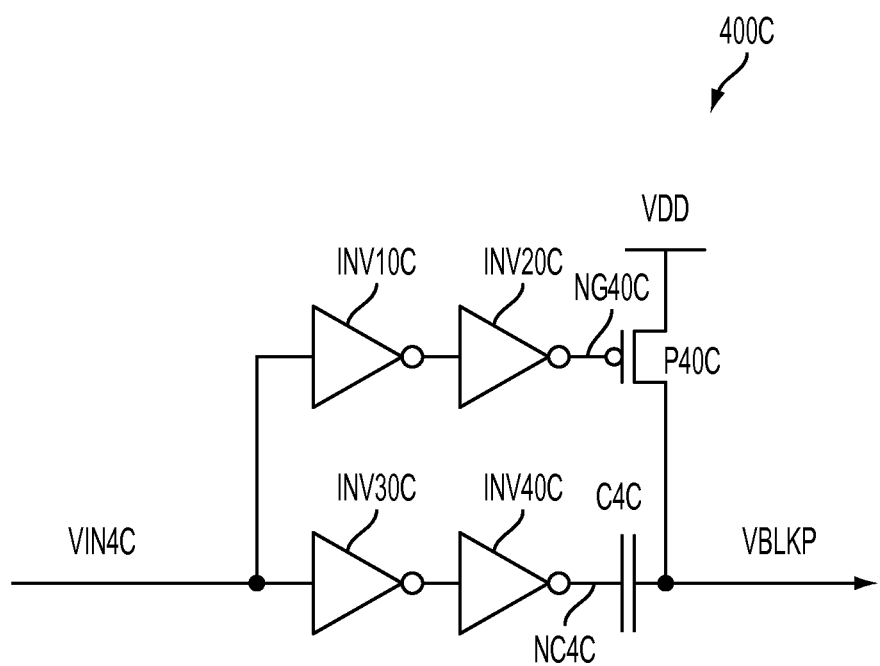
FIG. 4C is a diagram of another circuit generating voltage VBLKP, in accordance with some embodiments.

FIG. 4C is a diagram of a circuit 400C, in accordance with some embodiments. Circuit 400C is used to provide a voltage value for voltage VBLKP. In some embodiments, a voltage VIN4C is logically low prior to time t310 and subsequent to time t320, and is logically high between time t310 and time t320.

By operations of inverters INV10C and INV20C, when voltage VIN4C is logically low, node NG40C at an output of inverter INV20C and a gate of a PMOS transistor P40C is also logically low. As a result, voltage VBLKP at a drain of PMOS transistor P40C is pulled to voltage VDD at a source of transistor P40C. Effectively, voltage VBLKP has a value of supply voltage VDD.

In contrast, when voltage VIN4C transitions to a high logical value, such as voltage VDD, node NG40C transitions to a high logical value. As a result, PMOS transistor P40C is turned off. Further, by operations of inverters INV30C and INV40C as voltage VIN4C is at voltage VDD, node NC4C at an output of inverter INV40C and a first terminal of a capacitor C4C is also at voltage VDD. By operation of capacitor C4C, because the drain of PMOS transistor P40C is at voltage VDD and node NC4C is at voltage VDD, voltage VBLKP at the drain of PMOS transistor P40C is "pumped" or increased by a voltage value. In some embodiments, a value of capacitor C4C and a size of transistor P40C are selected to obtain a predetermined voltage increase ΔVP for voltage VBLKP. In some embodiments voltage ΔVP is 100 mV. In some embodiments, voltage ΔVP is obtained by simulation based on capacitance values of capacitor C4C and sizes of transistor P40C.

Figure 4D:
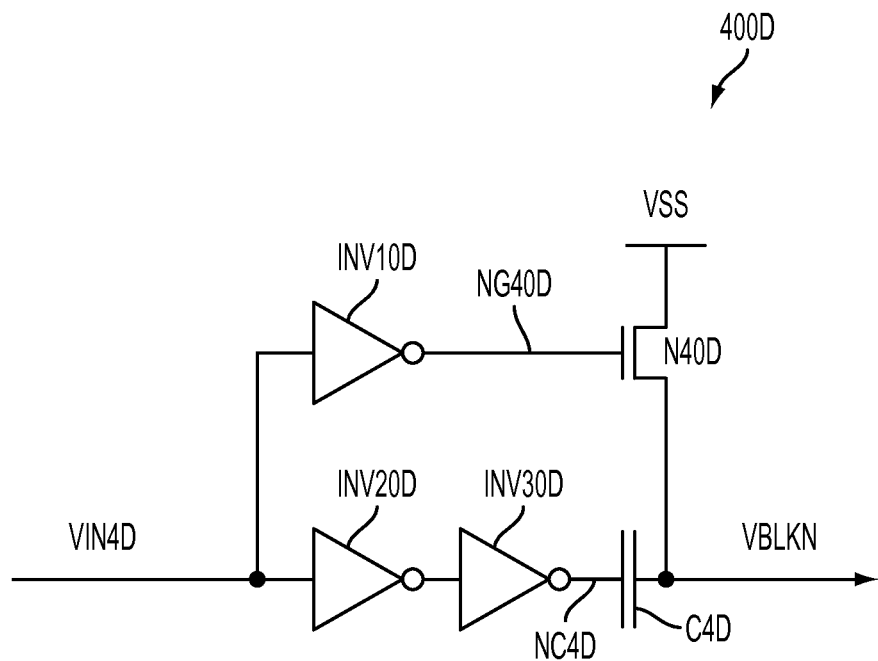
FIG. 4D is a diagram of another circuit generating voltage VBLKN, in accordance with some embodiments.

FIG. 4D is a diagram of a circuit 400D, in accordance with some embodiments. Circuit 400D is used to provide a voltage value for voltage VBLKN. In some embodiments, a voltage VIN4D is logically low prior to time t310 and subsequent to time t320, and is logically high between time t310 and time t320.

By operation of an inverter INV10D, when voltage VIN4D is logically low, node NG40D at an output of inverter INV10D and a gate of an NMOS transistor N40D is logically high. As a result, transistor N40D is turned on, and voltage VBLKN at a drain of NMOS transistor N40D is pulled to voltage VSS at a source of transistor N40D. Effectively, voltage VBLKN has a value of supply voltage VSS, which, in some embodiments, is 0 V.

In contrast, when voltage VIN4D transitions to a high logical value, such as voltage VDD, node NG40D is logically low. As a result, NMOS transistor N40D is turned off. Further, as voltage VIN4D is at voltage VDD, by operations of inverters INV20D and INV30D, node NC4D at an output of inverter INV30D and a first terminal of a capacitor C4D is also at voltage VDD. A second terminal of capacitor C4D is coupled with a drain of transistor N40D. By operation of capacitor C4D, because the drain of NMOS transistor N40D is at 0V and node NC4D is at voltage VDD, voltage VBLKN at the drain of NMOS transistor N40D is increased by a voltage value. In some embodiments, a value of capacitor C4D and a size of transistor N40D are selected to obtain a predetermined voltage value ΔVN as a voltage increase for voltage VBLKN. In some embodiments, voltage VBLKN is 100 mV. In some embodiments, voltage ΔVN is obtained by simulation based on capacitance values of capacitor C4D and sizes of transistor N40D.

Figure 4E:
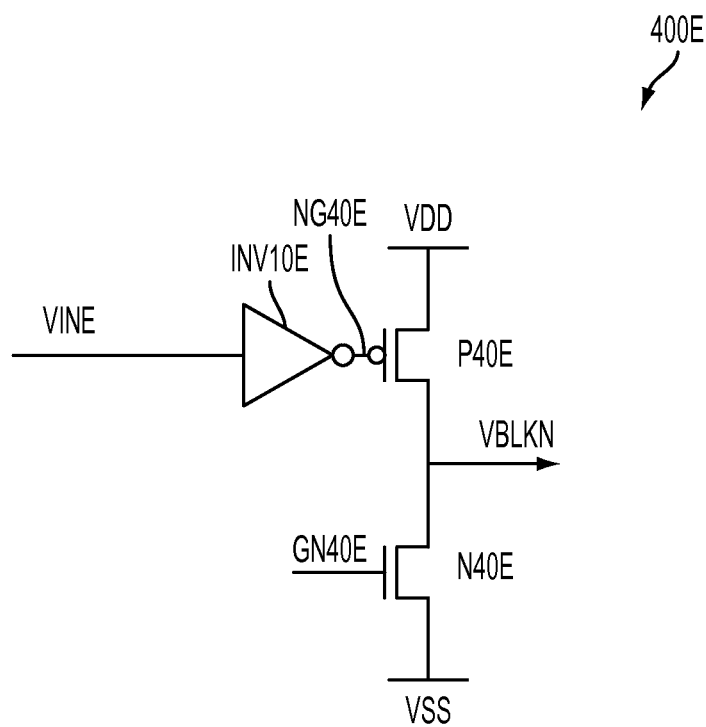
FIG. 4E is a diagram of another circuit generating voltage VBLKN, in accordance with some embodiments.

FIG. 4E is a diagram of a circuit 400E, in accordance with some embodiments. Circuit 400E is used to provide a voltage value for voltage VBLKN. In some embodiments, a voltage VIN4E is logically low prior to time t310 and subsequent to time t320, and is logically high between time t310 and time t320.

By operation of an inverter INV10E, when signal VIN4E is logically low, node NG40E at an output of inverter INV10E and at a gate of a PMOS transistor P40E is logically high, PMOS transistor P40E is turned off. In some embodiments, a voltage GN40E at a gate of NMOS transistor N40E is applied with a voltage value, such as a high logical value, so that transistor N40E is turned on. Because PMOS transistor P40E is turned off and NMOS transistor N40E is turned on, voltage VBLKN at drains of transistors P40E and N40E is pulled to voltage VSS or 0 V at the source of transistor N40E. In other words, voltage VBLKN is 0 V.

When voltage VINE transitions to a high logical value, node NG40E transitions to a low logical value. As a result, PMOS transistor P40E is turned on. Because transistor P40E is turned on, transistor P40E tends to pull voltage VBLKN at a drain of transistor P40E towards voltage VDD at a source of transistor P40E. Effectively, transistor P40E being turned on causes an increase in voltage VBLKN. In some embodiments, a size of each of transistor N40E and transistor P40E is selected for voltage VBLKN to increase by a predetermined voltage value $\Delta$VN. In some embodiments, voltage $\Delta$VN is 100 mV. In some embodiments, voltage $\Delta$VN is obtained by simulation based on sizes of transistors P40E and N40E.

Method

Figure 5:
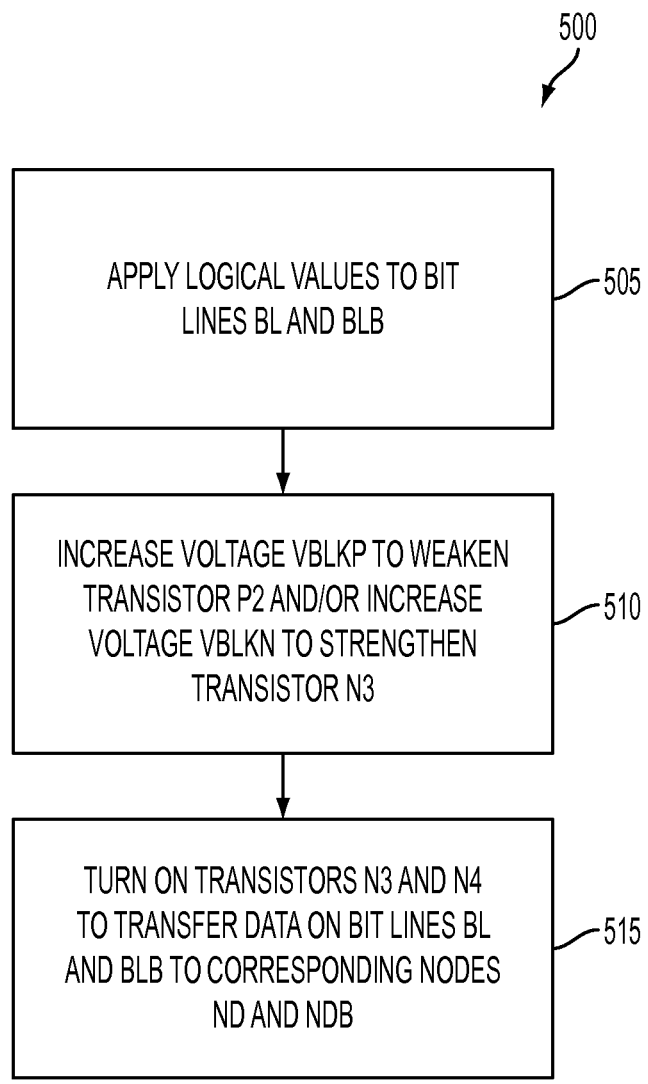
FIG. 5 is a flowchart of a method of writing data to the memory cell in FIG. 2, in accordance with some embodiments.

FIG. 5 is a flowchart of a method 500, in accordance with some embodiments. Method 500 includes a write operation of memory cell 200 in FIG. 2. In this illustration, node ND stores a high logical value, and is written with a low logical value. As a result, by operation of memory cell 100, node NDB stores a low logical value, and is written with a high logical value. Voltage VBLKP is at the default value of supply voltage VDD, and voltage VBLKN is at the default value of supply reference voltage VSS.

In operation 505, a low logical value and a high logical value are applied to bit lines BL and BLB, respectively.

In operation 510, voltage VBLKP is increased by voltage $\Delta$VP. In some embodiments, circuit 400A in FIG. 4A is used to switch voltage VBLKP from voltage VDD to voltage VDD+$\Delta$VP. In some embodiments, voltage VBLKP is increased by transitioning voltage VIN4C from a low to a high logical value as explained in FIG. 4C. As voltage VBLKP is increased, PMOS transistor P2 is weakened. Alternatively and/or additionally, voltage VBLKN is increased by voltage $\Delta$VN, using circuit 400B, circuit 400D, or circuit 400E, for example. As a result, NMOS transistor N3 is strengthened.

In operation 515, word line WL is applied with a high logical value. As a result, transistors N3 and N4 are turned on. The low and high logical value of respective bit lines BL and BLB are therefore transferred to corresponding nodes ND and NDB. In other words, nodes ND and NDB are written with a low and a high logical value, respectively.

In the above illustration, in operation 510, PMOS transistor P2 is weakened and/or NMOS transistor N3 is strengthened. As a result, after transistors N3 and N4 are turned on in operation 515, transferring data from bit lines BL and BLB to nodes ND and NDB is faster than transferring data from bit lines BL and BLB to nodes ND and NDB when PMOS transistor P2 is not weakened and/or transistor N3 is not strengthened. In other words, a writing speed of memory cell 200 increases.

Writing a low logical value to node ND is for illustration. By operation of memory 100, writing a high logical value to node ND is done based on writing a low logical value to node NDB. Writing a low logical value to node NDB with reference to bit line BLB, transistor P1, transistor N1, and transistor N4 is similar to writing a low logical value to node ND with reference to corresponding bit line BL, transistor P2, transistor N2, and transistor N3 as explained above.

Method 500 used for memory cell 200 is for illustration. Method 500 used for memory cell 100 is applicable and is within the contemplated scope of the present disclosure.

Additional Memory Cells

Figure 6:
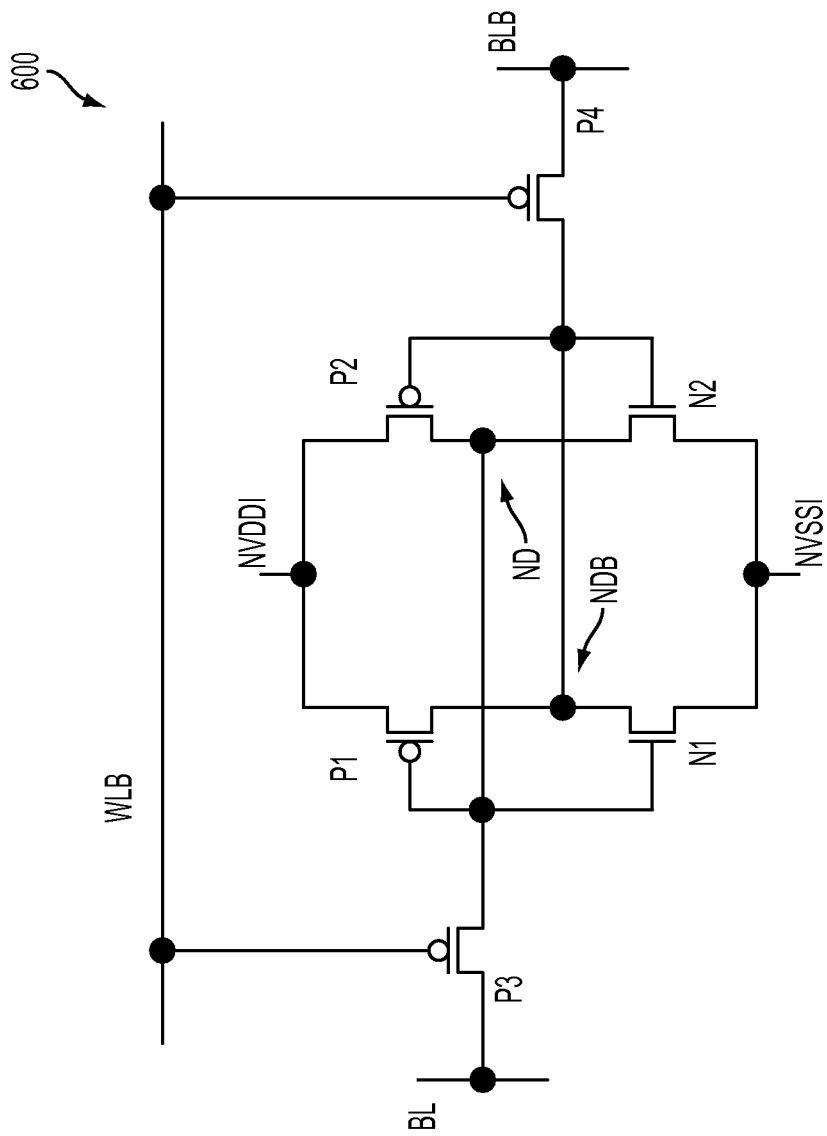
FIG. 6 is a diagram of a circuit of another memory cell, in accordance with some embodiments.

FIG. 6 is diagram of a circuit or memory cell 600, in accordance with some embodiments.

Compared with circuit 100 in FIG. 1, PMOS transistors P3 and P4 replace NMOS transistors N3 and N4 in FIG. 1. In some embodiment, bulks of PMOS transistors P1 and P2 are coupled together (not shown) and receive supply voltage VDD (not shown). Further, bulks of NMOS transistors N1 and N2 are coupled together (not shown) and receive reference voltage VSS (not shown). A word line WLB replaces word line WL in FIG. 1.

Figure 7A:
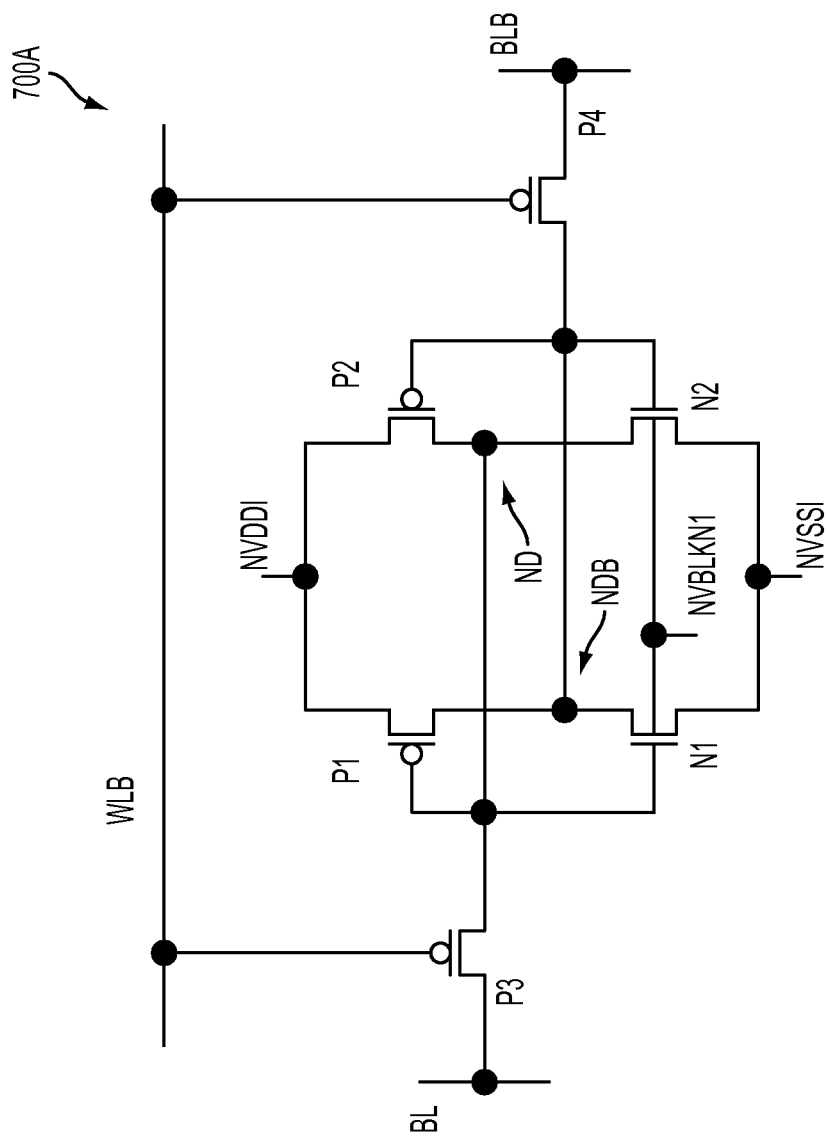
FIG. 7A is a diagram of a circuit of another memory cell, in accordance with some embodiments.

FIG. 7A is a diagram of a circuit or memory cell 700A, in accordance with some embodiments. Compared with circuit 600 in FIG. 6, bulks of NMOS transistors N1 and N2 in FIG. 7A are coupled together to form a node NVBLKN1 having a bulk-biasing voltage VBLKN1 (not labeled).

For illustration, node ND stores a low logical value, and is written with a high logical value. Because node ND stores a low logical value, by operation of memory cell 700A, node NDB stores a high logical value. As a result, PMOS transistor P1 is on, NMOS transistor N1 is off, PMOS transistor P2 is off, and NMOS transistor N2 is on. In some embodiments, a high logical value is applied to bit line BL. Word line WLB is activated to turn on transistor N3.

Because PMOS transistor P3 is on, PMOS transistor P3 tends to pull node ND towards a high logical value of bit line BL. Because NMOS transistor N2 is on, NMOS transistor N2 tends to pull node ND towards supply reference voltage VSS on node NVSSI at the source of NMOS transistor N2. Explained in a different way, a contention exists between PMOS transistor P3 and NMOS transistor N2.

In various embodiments of the present disclosure, mechanisms are provided to reduce the contention between PMOS transistor P3 and NMOS transistor N2. For example, in the embodiments of FIG. 7A, voltage VBLKN1 on node NVBLKN1 is adjusted to reduce the contention. In some embodiments, when voltage VBLKN1 is decreased, the driving strength of transistor N2 becomes weaker. Relatively, the driving strength of transistor P3 becomes stronger. As a result, the contention between transistor P3 and transistor N2 is reduced. Consequently, writing a logical high value to overwrite a low logical value on node ND becomes faster.

For illustration, voltage VBLKN1 is at a default voltage value of reference supply voltage VSS or 0 V. Voltage VBLKN1 is decreased to be lower than voltage value VSS by a voltage $\Delta$VN1. In some embodiments, voltage $\Delta$VN1 is determined based on simulation. For example, a plurality of N memory cells 700A is selected for the simulation. Voltage $\Delta$VN1 is set to be about 150 mV. In some embodiments, with a voltage level of about 150 mV of voltage $\Delta$VN1, voltage VBLKN1 is about −150 mV. As a result, the data stored in some cells 700A is reliably valid, while the data stored in some other cells 700A is no longer valid. Voltage $\Delta$VN1 is then increased until the data stored in all N memory cells 700A is reliably valid. At that point, voltage $\Delta$VN1 is chosen. In some embodiments, voltage $\Delta$VN1 is about 100 mV for voltage VBLKN1 to be about −100 mV, and N memory cells 700A to store data validly. An increase in a writing speed of N memory cells 600 is achieved based on voltage $\Delta$VN1 of about 100 mV. The above mechanism to determine voltage ΔVN1 is for illustration. Other ways to determine voltage ΔVN1 are within the contemplated scope of the present disclosure. For example, voltage ΔVN1 is determined based on a binary search, by being set at 0 V and decreased until at least one memory cell fails, and the value prior to the at least one memory cell fails is chosen.

Figure 7B:
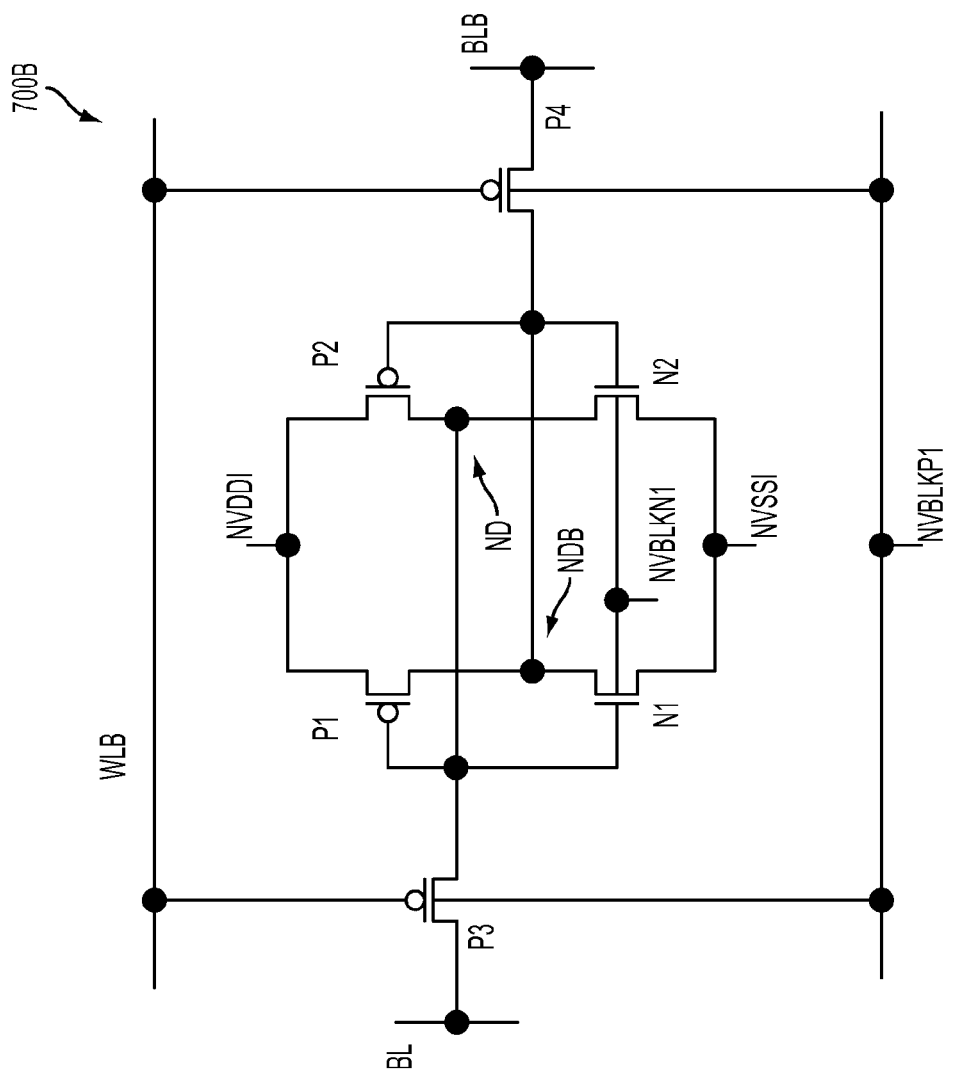
FIG. 7B is a diagram of a circuit of another memory cell, in accordance with some embodiments.

FIG. 7B is a diagram of a circuit 700B, in accordance with some embodiments.

Compared with circuit 700A, bulks of transistors P3 and P4 in FIG. 7B are coupled together and form a node NVBLKP1 having a bulk-biasing voltage VBLKP1 (not labeled). For illustration, voltage VBLKN1 on node NVBLKN1 is set at voltage VSS. In some embodiments, bulks of PMOS transistors P1 and P2 are not coupled with the bulks of transistors P3 and P4 as shown on FIG. 7. In some embodiments, the bulks of PMOS transistors P1 and P2 are coupled with the bulks of PMOS transistors P3 and P4, and therefore also receive voltage VBLKP1.

In the embodiments of FIG. 7B, voltage VBLKP1 on node NVBLKP1 is adjusted to reduce the contention between PMOS transistor P3 and NMOS transistor N2. In some embodiments, voltage VBLKP1 is set to a default value of supply voltage VDD. When voltage VBLKP1 is decreased below supply voltage VDD, PMOS transistor P3 becomes stronger. As a result, PMOS transistor P3 is dominant, and the contention between PMOS transistor P3 and NMOS transistor N2 is reduced. Consequently, writing a logical high value to overwrite a low logical value on node ND becomes faster. In other words, a writing speed to node ND and memory cell 700 increases.

For illustration, voltage value VBLKP1 is set to a default value of 1.0 V. Voltage VBLKP1 is then decreased to be lower than supply voltage VDD by a voltage ΔVP1. In some embodiments, voltage ΔVP1 is determined based on simulation. For example, a plurality of N memory cells 700B is selected for the simulation. Voltage ΔVP1 is set to be about 150 mV. As a result, voltage VBLKP1 is at about 0.85V (1.0 V-150 mV), and the data stored in some memory cells 700B is reliably valid, while the data stored in some other memory cells 700B is no longer valid. Voltage VBLKP1 and ΔVP1 are then increased until the data stored in all N memory cells 700B is reliably valid. The voltage value of voltage ΔVP1 at that point is chosen for use in circuit 700B. In some embodiments, voltage ΔVP1 is about 100 mV for the data stored in N memory cells 700B is reliably valid. An increase in a writing speed of N memory cells 700B is achieved based on voltage ΔVP1 of about 100 mV. The above mechanism to determine voltage ΔVP1 is for illustration. Other ways to determine voltage ΔVP1 are within the contemplated scope of the present disclosure. For example, voltage ΔVP1 is determined based on a binary search, by being set at 1.0 V and is decreased until at least one memory cell 700B fails and the value prior to at least one memory cell 700B fails is selected.

In the above illustration with reference to FIGS. 7A and 7B, each of voltage ΔVN1 or ΔVP1 is adjusted separately for illustration. Both voltages ΔVN1 and ΔVP1 being adjusted are within the contemplated scope of the present disclosure.

Figure 8:
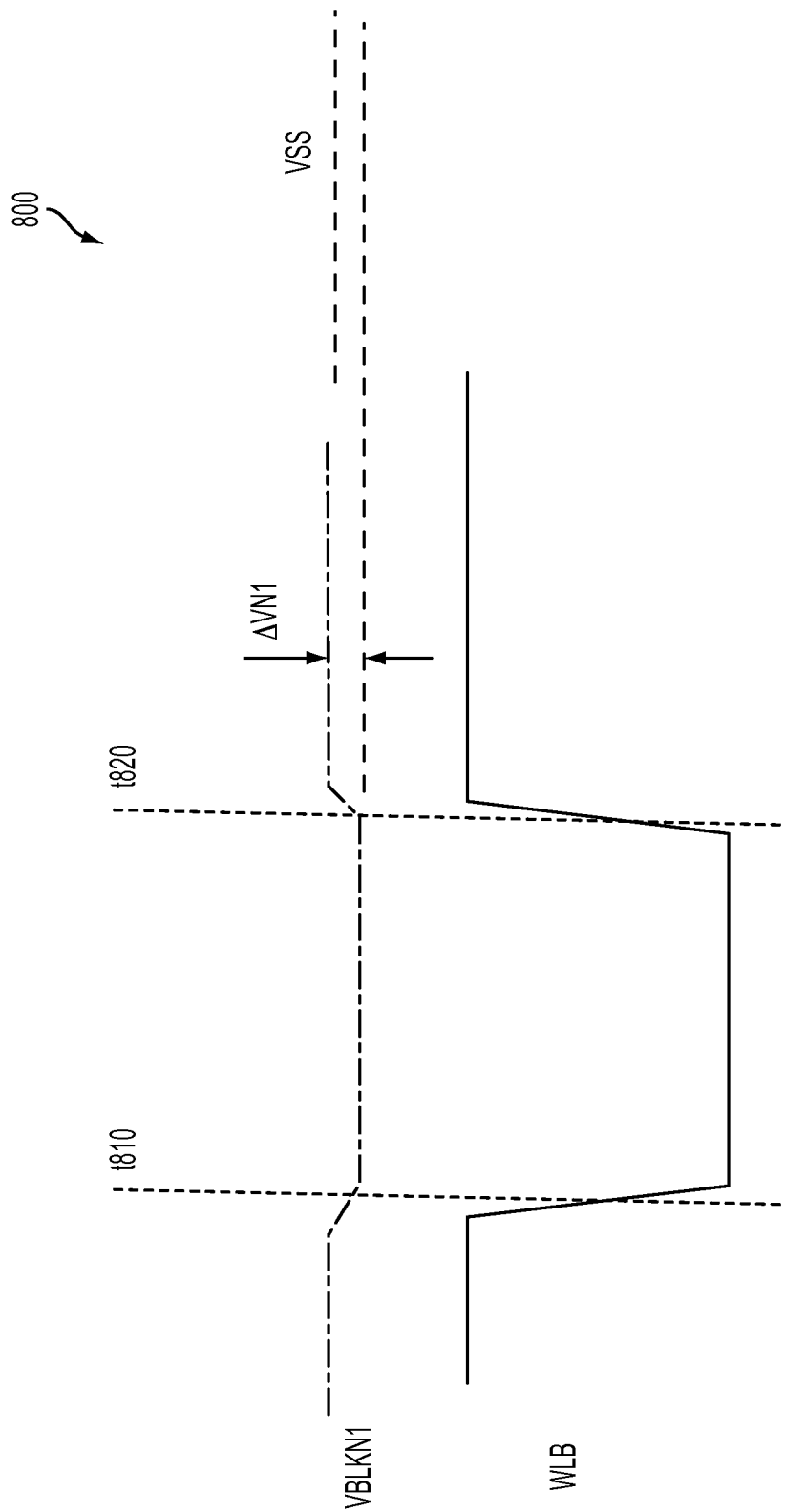
FIG. 8 is a graph of waveforms of various signals of the memory cell in FIG. 7B, in accordance with some embodiments.

FIG. 8 is a graph of waveforms 800, in accordance with some embodiments. Waveforms 800 are used to illustrate when voltage VBLKN1 is at the default value of voltage VSS or is decreased. Prior to a time t810, voltage VBLK1 is at the default value.

At about time t810, word line WLB transitions from a high to a low logical value. As word line WLB is logically low, transistor P3 is turned on, and the data on bit line BL is transferred to node ND. At about time t810 or prior to time t810, voltage VBLKN1 is lowered from voltage VSS by voltage ΔVN1. Because voltage VBLKN1 is lowered, NMOS transistor N2 is weaken. By the time word line WLB is logically low and transistor P3 is turned on, a time to replace existing data on node ND by the data transferred from bit line BL is decreased. Effectively, writing data to node ND or to memory cell 600 is faster.

At a time t820, when writing data to node ND is complete, word line WLB transitions from a low to a high logical value. At about time t820 or subsequent to time t820, voltage VBLKN1 returns to the default value of voltage VSS.

In FIG. 8 voltage VBLKN1 is used for illustration. Voltage VBLKP1 is adjusted in a manner similar to voltage VBLKN1 in FIG. 8. For example, at about time t810 or prior to time t810, voltage VBLKP1 is decreased from voltage VDD by voltage ΔVP1. At about time t820 or subsequent to time t320, voltage VBLKP1 returns to the default value of voltage VDD.

Figure 9A:
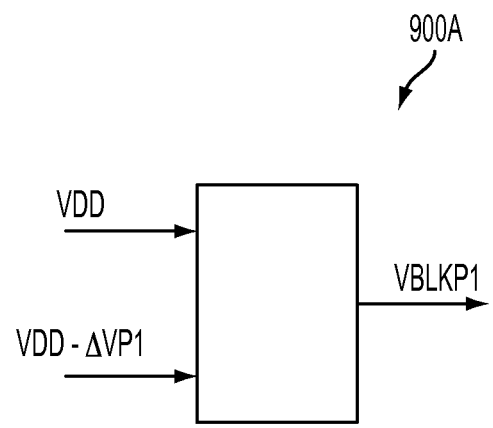
FIG. 9A is a diagram of a circuit generating voltage VBLKP1, in accordance with some embodiments.

FIG. 9A is diagram of a selection circuit 900A, in accordance with some embodiments. Selection circuit 900A is used to provide a voltage value for voltage VBLKP1. For example, prior to time t810 and subsequent to time t820 in FIG. 8, circuit 900A selects voltage value VDD as the default voltage value for voltage VBLKP1. In contrast, between time t810 and time t820, circuit 900A selects a voltage value VDD-ΔVP1 as a value for voltage VBLKP1. Explained in a different way, voltage VBLKP1 is at the default value of voltage VDD before time t810 and after time t820, and is lowered by voltage ΔVP1 between time t810 and time t820.

Figure 9B:
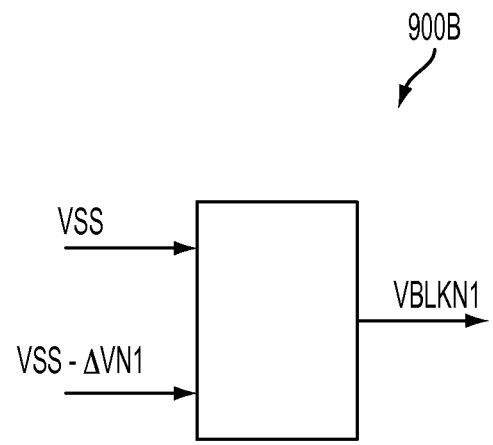
FIG. 9B is a diagram of a circuit generating voltage VBLKN1, in accordance with some embodiments.

FIG. 9B is diagram of a selection circuit 900B, in accordance with some embodiments. Selection circuit 900B is used to provide a voltage value for voltage VBLKN1. For example, prior to time t810 and subsequent to time t820 in FIG. 8, circuit 900B selects voltage value VSS as a default voltage value for voltage VBLKN1. In contrast, between time t810 and time t820, circuit 900B selects a voltage value VSS−ΔVN1 as a value for voltage VBLKN1. Explained in a different way, voltage VBLKN1 is at a default value before time t810 and after time t820, and is lowered by voltage ΔVN1 between time t810 and time t820.

Figure 9C:
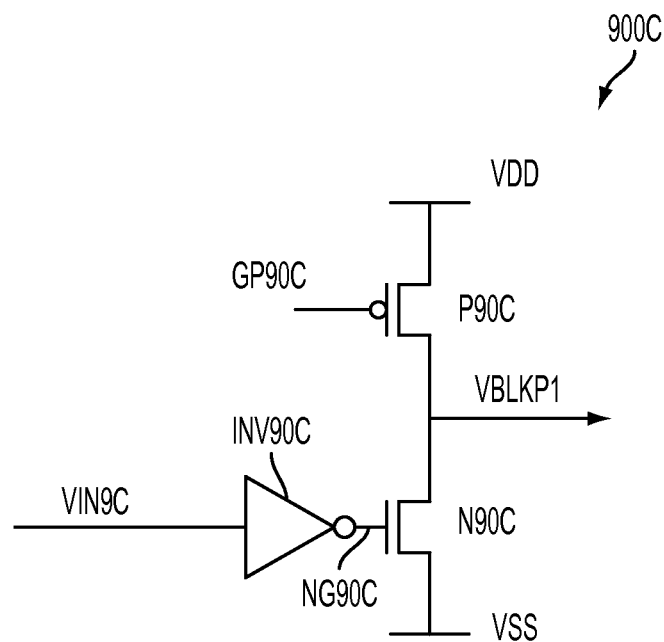
FIG. 9C is a diagram of another circuit generating voltage VBLKP1, in accordance with some embodiments.

FIG. 9C is a diagram of a circuit 900C, in accordance with some embodiments. Circuit 900C is used to provide a voltage value for voltage VBLKP1.

By operation of an inverter INV90C, when a signal VIN9C is logically high, a node NG90C at an output of an inverter INV90C and a gate of an NMOS transistor N90C is logically low. As a result, NMOS transistor N90CC is turned off. In some embodiments, a voltage GP90C at a gate of PMOS transistor P90C is applied with a low logical value, such as 0 V, for transistor P90C to turn on. Because transistor N90C is off and transistor P90C is on, a drain of transistor P90C has a voltage at a source of transistor P90C. Effectively, voltage VBLKP1 has a voltage value VDD at the source of transistor P90C. As a result, voltage VBLKP1 has a default voltage value of VDD.

When signal VIN9C transitions to a low logical value, node NG90C transitions to a high logical value. As a result, transistor N90C is turned on. Consequently transistor N90C tends to pull voltage VBLKP1 towards voltage VSS at a source of transistor N90C. Effectively, transistor N90C turning on causes voltage VBLKP1 to decrease. In some embodiments, a size of transistor P90C and a size of transistor N90C are selected for voltage VBLKP1 to decrease by a predetermined voltage value ΔVP1. In some embodiments, voltage ΔVP1 is about 100 mV. In some embodiments, voltage ΔVP1 is obtained by simulation based on sizes of transistors P90C and N90C.

Figure 9D:
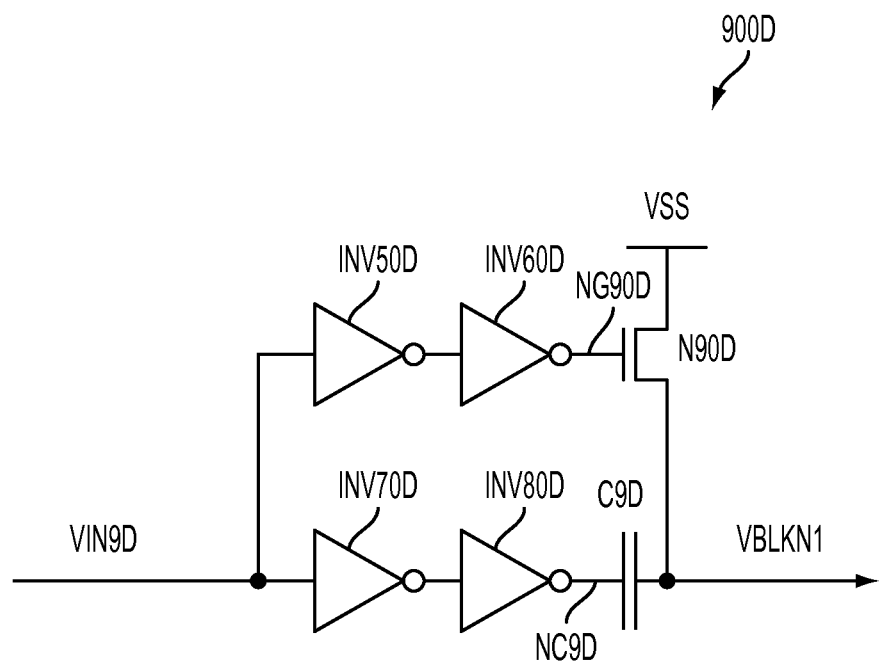
FIG. 9D is a diagram of another circuit generating voltage VBLKN1, in accordance with some embodiments.

FIG. 9D is a diagram of a circuit 900D, in accordance with some embodiments. Circuit 900D is used to provide a voltage value for voltage VBLKN1.

By operation of inverters INV50D and INV60D, when voltage VIN9D is logically high, node NG90D at an output of inverter INV60D and a gate of an NMOS transistor N90D is also logically high. As a result, transistor N90D is turned on, and voltage VBLKN1 at a drain of NMOS transistor N90D is pulled to voltage VSS at a source of transistor N90D. Effectively, voltage VBLKN1 has a value of voltage VSS.

In contrast, when voltage VIN9D transitions from a high to a low logical value, such as voltage VSS, node NG90D also transitions to a low logical value. As a result, NMOS transistor N90D is turned off. Further, as voltage VIN9D is at voltage VSS, by operations of inverters INV70D and INV80D, a node NC9D at an output of inverter INV80D and a first terminal of capacitor NC9D is also at voltage VSS. A second terminal of capacitor C9D is coupled with a drain of transistor N90D. By operation of capacitor C9D, because the drain of NMOS transistor N90D is at voltage VSS and node NC9D is at voltage VSS, voltage VBLKN1 at the drain of NMOS transistor N90D is decreased by a voltage value. In some embodiments, a capacitance value of capacitor C9D and a size of transistor N90D are selected to obtain a predetermined voltage $\Delta N1$ for voltage VBLKN1. In some embodiments voltage $\Delta N1$ is 100 mV. In some embodiments, voltage $\Delta N1$ is obtained by simulation based on capacitance values of capacitor C9D and sizes of transistor N90D.

Method

Figure 10:
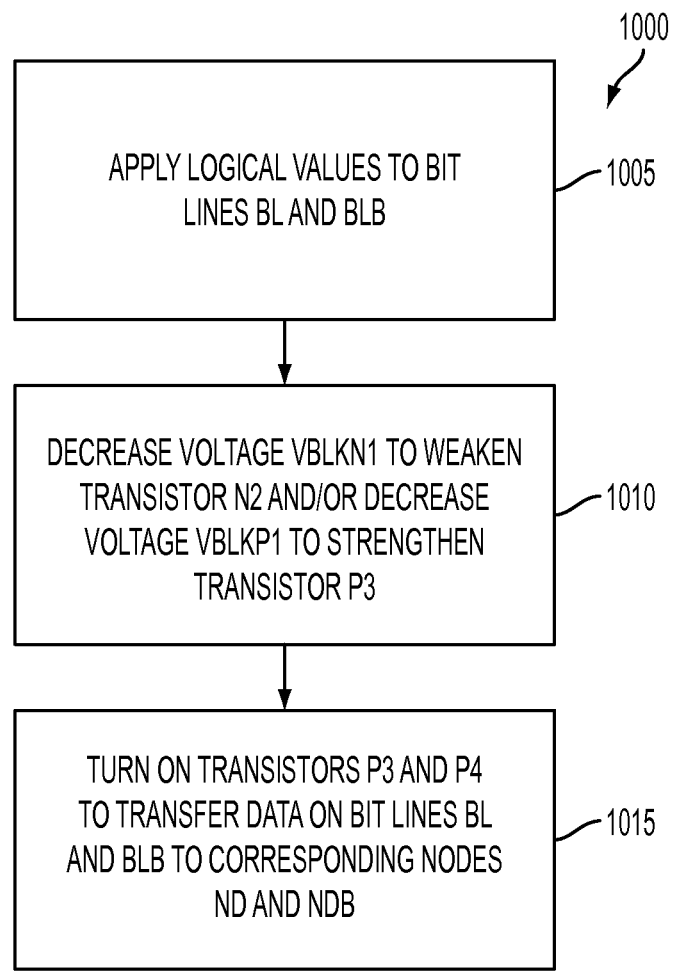
FIG. 10 is a flowchart of a method of writing data to the memory cell in FIG. 7B, in accordance with some embodiments.

FIG. 10 is a flowchart of a method 1000, in accordance with some embodiments. Method 1000 includes a write operation of memory cell 700B in FIG. 7B. In this illustration, node ND stores a low logical value, and is written with a high logical value. By operation of memory cell 700B, node NDB stores a high logical value, and is written with a low logical value. Voltage VBLKN1 is at the default value of supply voltage VSS, and voltage VBLKP1 is at the default value of supply voltage VDD.

In operation 1005, a high logical value and a low logical value are applied to bit lines BL and BLB, respectively.

In operation 1010, voltage VBLKN1 is lowered by voltage $\Delta VN1$. In some embodiments, circuit 900A in FIG. 9A is used to switch voltage VBLKN1 from voltage VSS to voltage VSS–$\Delta VN1$. In some embodiments, voltage VBLKN1 is lowered by transitioning voltage VIN9D from a high to a low logical value as explained in FIG. 9D. As voltage VBLKN1 is lowered, NMOS transistor N2 is weakened. Alternatively and/or additionally, voltage VBLKP1 is lowered by voltage $\Delta VP1$, using circuit 900B or 900C, for example. As a result, PMOS transistor P3 is strengthened.

In operation 1015, word line WLB is applied with a low logical value. As a result, transistors P3 and P4 are turned on. The high and low logical values of respective bit lines BL and BLB are therefore transferred to corresponding nodes ND and NDB. In other words, nodes ND and NDB are written with a high and a low logical value, respectively.

In the above illustration, in operation 1010, NMOS transistor N2 is weakened and/or PMOS transistor P3 is strengthened. As a result, after transistors P3 and P4 are turned on in operation 1015, transferring data from bit lines BL and BLB to nodes ND and NDB is faster than transferring data from bit lines BL and BLB to nodes ND and NDB when NMOS transistor N2 is not weakened and/or PMOS transistor P3 is not strengthened. In other words, a writing speed of memory cell 700B is improved.

In FIG. 10, memory cell 700B is used for illustration. The method 1000 is also applicable to memory cell 600 or memory cell 700A.

In some embodiments, a circuit comprises a first transistor of a first type, a second transistor of a second type, and a third transistor of the first type or the second type. The first transistor and the second transistor form an inverter. The third transistor is coupled with an output of the inverter. The circuit includes at least one of the following voltage sources: a first voltage source, a second voltage source, and a third voltage source. The first voltage source is coupled with a bulk of the first transistor, and is different from a first supply voltage source of the first transistor. T second voltage source is coupled with a bulk of the second transistor, and is different from a second supply voltage of the second transistor. The third voltage source is coupled with a bulk of the third transistor.

In some embodiments, a circuit comprises a first transistor of a first type, a second transistor of the first type, a third transistor of a second type, a fourth transistor of the second type, a fifth transistor of either the first type or the second type, and a sixth transistor of either the first type or the second type. A first terminal of the first transistor is coupled with a first terminal of the second transistor, and is configured as a first voltage node. A second terminal of the first transistor is coupled with a second terminal of the third transistor, with a first terminal of the fifth transistor, with a third terminal of the second transistor, and with a third terminal of the fourth transistor, and is configured as a first data node. A third terminal of the first transistor is coupled with a third terminal of the third, with a second terminal of the second transistor, with a second terminal of the fourth transistor, and with a first terminal of the sixth transistor, and is configured as a second data node. A first terminal of the third transistor is coupled with a first terminal of the second fourth, and is configured as a second voltage node. The circuit is configured to meet at least one of the following conditions 1) a fourth terminal of the first transistor is coupled with a fourth terminal of the second and is configured as a third voltage node selectively receiving a first supply voltage or a first voltage different from the first supply voltage; or 2) a fourth terminal of the fifth transistor is coupled with a fourth terminal of the sixth transistor, and is configured as a fourth voltage node selectively receiving a second supply voltage or a second voltage different from the second supply voltage; or 3) a fourth terminal of the third transistor is coupled with a fourth terminal of the fourth, and is configured as a fifth voltage node selectively receiving a third supply voltage or a third voltage different from the third supply voltage.

In some embodiments, a method is based on a first transistor and a second transistor, wherein a first terminal of the first transistor is coupled with a first terminal of the second transistor at a data node. A voltage value at a bulk of the first transistor is adjusted and/or a voltage value at a bulk of the second transistor is adjusted. Data at a second terminal of the second transistor is transferred to the data node.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

Various figures showing a capacitor is for illustration. Equivalent circuitry may be used. For example, a capacitive device, circuitry or network (e.g., a combination of capacitors, capacitive devices, circuitry, etc.) can be used in place of the capacitor. Circuits 100, 200, 600, 700A, and 700B each functioning as a memory cell are for illustration. Circuits 100, 200, 600, 700A, or 700B functioning for other purposes are within the contemplated scope of the present disclosure.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit comprising:
   a first transistor of a first type;
   a second transistor of a second type;
   a third transistor of the first type or the second type; and
   at least one of a first voltage source, a second voltage source, or a third voltage source,
   wherein
      the first transistor and the second transistor form an inverter;
      the third transistor is coupled with an output of the inverter;
      the first voltage source is coupled with a bulk of the first transistor and is different from a first supply voltage source of the first transistor;
      the second voltage source is coupled with a bulk of the second transistor, and is different from a second supply voltage source of the second transistor; and
      the third voltage source is coupled with a bulk of the third transistor.

2. The circuit of claim 1, wherein
   the third voltage source is different from the first supply voltage source.

3. The circuit of claim 1, wherein
   the third voltage source is the same as the first supply voltage source.

4. The circuit of claim 1, wherein
   the third voltage source is different from the second supply voltage source.

5. The circuit of claim 1, wherein
   the third voltage source is the same as the second supply voltage source.

6. A circuit comprising:
   a first transistor of a first type;
   a second transistor of the first type;
   a third transistor of a second type;
   a fourth transistor of the second type;
   a fifth transistor of either the first type or the second type; and
   a sixth transistor of either the first type or the second type,
   wherein
      a first terminal of the first transistor is coupled with a first terminal of the second transistor, and is configured as a first voltage node;
      a second terminal of the first transistor is coupled with a second terminal of the third transistor, with a first terminal of the fifth transistor, with a third terminal of the second transistor, and with a third terminal of the fourth transistor, and is configured as a first data node;
      a third terminal of the first transistor is coupled with a third terminal of the third transistor, with a second terminal of the second transistor, with a second terminal of the fourth transistor, and with a first terminal of the sixth transistor and is configured as a second data node;
      a first terminal of the third transistor is coupled with a first terminal of the fourth transistor, and is configured as a second voltage node; and
      the circuit is configured to meet at least one of the following conditions
         a fourth terminal of the first transistor is coupled with a fourth terminal of the second transistor and is configured as a third voltage node selectively receiving a first supply voltage or a first voltage different from the first supply voltage; or
         a fourth terminal of the fifth transistor is coupled with a fourth terminal of the sixth transistor and is configured as a fourth voltage node selectively receiving a second supply voltage or a second voltage different from the second supply voltage; or
         a fourth terminal of the third transistor is coupled with a fourth terminal of the fourth transistor and is configured as a fifth voltage node selectively receiving a third supply voltage or a third voltage different from the third supply voltage.

7. The circuit of claim 6, wherein
the circuit is configured as a memory cell;
the first data node is configured as a first storage node of the memory cell; and
the second data node is configured as a second storage node of the memory cell.

8. The circuit of claim 6, wherein
the circuit is configured as a memory cell;
a second terminal of the fifth transistor and a second terminal of the sixth transistor are coupled with a word line of the memory cell;
a third terminal of the fifth transistor is coupled with a first bit line of the memory cell; and
a third terminal of the sixth transistor is coupled with a second bit line of the memory cell.

9. The circuit of claim 6, wherein
the first type is a P-type;
the second type is an N-type;
the fifth transistor and the sixth transistor are of the second type;
the circuit is configured to meet at least one of the following additional conditions
   the third voltage node is configured to receive a voltage value greater than a voltage value of the first voltage node; or
   the fourth voltage node is configured to receive a voltage value greater than a voltage value of the second voltage node; or
   the fifth voltage node is configured to receive a voltage value greater than the voltage value of the second voltage node.

10. The circuit of claim 6, wherein
the first type is a P-type;
the second type is an N-type;
the fifth transistor and the sixth transistor are of the second type;
the fourth voltage node is coupled with the fifth voltage node; and the circuit is configured to meet at least one of the following additional conditions
the third voltage node is configured to receive a voltage value higher than a voltage value of the first voltage node; or
the fourth voltage node is configured to receive a voltage value higher than a voltage value of the second voltage node.

11. The circuit of claim 6 further comprising at least one of a first voltage generating circuit or a second voltage generating circuit,
wherein
the first voltage generating circuit includes
a first selection circuit configured to select a voltage value of the first voltage node or a voltage value higher than the voltage value of the first voltage node as a voltage value for the third voltage node; or
the second voltage generating circuit includes
a second selection circuit configured to select a voltage value of the second voltage node or a voltage value higher than the voltage value of the second voltage node as a voltage value for the fourth voltage node.

12. The circuit of claim 6 further comprising a voltage generating circuit,
wherein
the voltage generating circuit includes
a seventh transistor;
a capacitive device;
a first terminal of the seventh transistor is configured to receive a voltage value of the first voltage node;
a second terminal of the seventh transistor is configured to receive a control voltage;
a third terminal of the seventh transistor is coupled with a first end of the capacitive device, and is configured to provide a voltage value for the third voltage node; and
a second end of the capacitive device is configured to receive a control signal.

13. The circuit of claim 6, wherein
the first type is a P-type;
the second type is an N-type;
the fifth transistor and the sixth transistor are of the first type; and
the circuit is configured to meet at least one of the following additional conditions
the third voltage node is configured to receive a voltage value lower than a voltage value of the first voltage node; or
the fourth voltage node is configured to receive a voltage value lower than the voltage value of the first voltage node; or
the fifth voltage node is configured to receive a voltage value lower than a voltage value of the second voltage node.

14. The circuit of claim 6, wherein
the first type is a P-type;
the second type is an N-type;
the fifth transistor and the sixth transistor are of the first type;
the third voltage node is coupled with the fourth voltage node; and
the circuit is configured to meet at least one of the following additional conditions
the fourth voltage node is configured to receive a voltage value lower than a voltage value of the first voltage node; or
the fifth voltage node is configured to receive a voltage value lower than a voltage value of the second voltage node.

15. The circuit of claim 14 further comprising at least one of a first voltage generating circuit or a second voltage generating circuit,
wherein
the first voltage generating circuit includes
a first selection circuit configured to select the voltage value of the first voltage node or the voltage value lower than the voltage value of the first voltage node as a voltage value for the fourth voltage node; or
the second voltage generating circuit includes
a second selection circuit configured to select the voltage value of the second voltage node or the voltage value lower than the voltage value of the second voltage node as a voltage value for the third voltage node.

16. The circuit of claim 14 further comprising a voltage generating circuit,
wherein
the voltage generating circuit includes a seventh transistor and an eighth transistor;
a first terminal of the seventh transistor is configured to receive the voltage value of the first voltage node;
a second terminal of the seventh transistor is configured to receive a first control signal;
a third terminal of the seventh transistor is coupled with a third terminal of the eighth transistor, and is configured to provide the voltage value for the fourth voltage node;
a second terminal of the eighth transistor is configured to receive a second control signal.

17. A method comprising:
based on a first transistor and a second transistor, wherein a first terminal of the first transistor is coupled with a first terminal of the second transistor at a data node,
adjusting a voltage value at a bulk of the first transistor and/or adjusting a voltage value at a bulk of the second transistor; and
transferring data at a second terminal of the second transistor to the data node.

18. The method of claim 17, wherein
the first transistor is a P-type transistor;
adjusting the voltage value at the bulk of the first transistor comprises raising the voltage value at the bulk of the first transistor;
the second transistor is an N-type transistor; and
adjusting the voltage value at the bulk of the second transistor comprises raising the voltage value at the bulk of the second transistor.

19. The method of claim 17, wherein
the first transistor is an N-type transistor;
adjusting the voltage value at the bulk of the first transistor comprises lowering the voltage value at the bulk of the first transistor;
the second transistor is a P-type transistor; and
adjusting the voltage value at the bulk of the second transistor comprises lowering the voltage value at the bulk of the second transistor.

20. The method of claim 17, wherein
the data node is a storage node of a memory cell;

the second terminal of the second transistor is coupled with a bit line of a memory array having the memory cell; and
a third terminal of the second transistor is coupled with a word line of the memory array.

\* \* \* \* \*